(12) United States Patent
Liu et al.

(10) Patent No.: US 12,720,948 B2
(45) Date of Patent: Aug. 25, 2026

(54) LIGHT-EMITTING DIODE, DISPLAY PANEL, AND DISPLAY DEVICE

(71) Applicant: BOE Technology Group Co., Ltd., Beijing (CN)

(72) Inventors: Xinghua Liu, Beijing (CN); Xiaojin Zhang, Beijing (CN); Haiyan Sun, Beijing (CN); Yong Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 827 days.

(21) Appl. No.: 18/027,500

(22) PCT Filed: Jan. 6, 2021

(86) PCT No.: PCT/CN2021/070483
§ 371 (c)(1),
(2) Date: Mar. 21, 2023

(87) PCT Pub. No.: WO2022/147686
PCT Pub. Date: Jul. 14, 2022

(65) Prior Publication Data

US 2023/0380278 A1 Nov. 23, 2023

(51) Int. Cl.
*H10K 50/15* (2023.01)
*H10K 50/115* (2023.01)
(Continued)

(52) U.S. Cl.
CPC ............ *H10K 50/15* (2023.02); *H10K 85/00* (2023.02); *H10K 85/631* (2023.02);
(Continued)

(58) Field of Classification Search
CPC ...... H10K 50/15; H10K 85/00; H10K 85/631; H10K 85/654; H10K 85/6572;
(Continued)

(56) References Cited

U.S. PATENT DOCUMENTS

2004/0185300 A1 9/2004 Hatwar et al.
2018/0053907 A1 2/2018 He et al.
(Continued)

FOREIGN PATENT DOCUMENTS

CN 105870349 A 8/2016
CN 108137611 A 6/2018
(Continued)

OTHER PUBLICATIONS

PCT/CN2021/070483 international search report.

*Primary Examiner* — Dawn L Garrett
(74) *Attorney, Agent, or Firm* — IPro, PLLC

(57) ABSTRACT

Provided is a light-emitting diode. The light-emitting diode includes: an anode; a hole transport layer, disposed on a side of the anode and containing a hole transport material, wherein the hole transport material includes an organic small molecule material with a molecular weight less than 4000, and a hole mobility of the hole transport material is not less than $1\times E^{-5}$ $cm^2/(VS)$; a light-emitting layer, disposed on a side, distal from the anode, of the hole transport layer, and containing a quantum dot material; an electron buffer layer, disposed on a side, distal from the hole transport layer, of the light-emitting layer, and containing a thermally activated delayed fluorescent material; and a cathode, disposed on a side, distal from the light-emitting layer, of the electron buffer layer.

20 Claims, 5 Drawing Sheets

(51) Int. Cl.

| | |
|---|---|
| ***H10K 50/18*** | (2023.01) |
| ***H10K 85/00*** | (2023.01) |
| ***H10K 85/60*** | (2023.01) |
| ***H10K 101/10*** | (2023.01) |
| ***H10K 101/20*** | (2023.01) |
| ***H10K 102/00*** | (2023.01) |

(52) U.S. Cl.
CPC ....... *H10K 85/654* (2023.02); *H10K 85/6572* (2023.02); *H10K 50/115* (2023.02); *H10K 50/181* (2023.02); *H10K 2101/10* (2023.02); *H10K 2101/20* (2023.02); *H10K 2102/351* (2023.02)

(58) Field of Classification Search
CPC ............... H10K 50/115; H10K 50/181; H10K 2101/10; H10K 2101/20; H10K 2102/351; H10K 50/16
See application file for complete search history.

(56) References Cited

U.S. PATENT DOCUMENTS

| | | | |
|---|---|---|---|
| 2018/0233688 | A1 | 8/2018 | Chen et al. |
| 2019/0207124 | A1 | 7/2019 | Kanamoto et al. |
| 2020/0185632 | A1 | 6/2020 | Kim et al. |
| 2021/0320272 | A1 | 10/2021 | Yu |

FOREIGN PATENT DOCUMENTS

| | | | |
|---|---|---|---|
| CN | 110112305 | A | 8/2019 |
| CN | 110931649 | A | 3/2020 |
| CN | 111312911 | A | 6/2020 |

100
500
200
400
300

LIGHT-EMITTING DIODE, DISPLAY PANEL, AND DISPLAY DEVICE

CROSS-REFERENCE TO RELATED APPLICATIONS

This application is a U.S. national stage of international application No. PCT/CN2021/070483, filed on Jan. 6, 2021, the disclosure of which is incorporated herein by reference in its entirety.

TECHNICAL FIELD

The present disclosure relates to the field of display technologies, and in particular, relates to a light-emitting diode, a display panel, and a display device.

BACKGROUND OF THE INVENTION

Quantum dot organic light-emitting devices (QLED) have attracted much attention due to advantages of high quantum dot efficiency, high color purity, great processability, low cost, and easy adjustment of emission wavelength. Similar to conventional light-emitting diodes, in addition to an anode, a cathode, and a light-emitting layer, the QLED is disposed with a hole transport layer and the like to further improve a property of the QLED.

SUMMARY OF THE INVENTION

Embodiments of the present disclosure aim to alleviate or solve at least one of the above problems to at least some extent.

In some embodiments of the present disclosure, a light-emitting diode is provided. The light-emitting diode includes: an anode; a hole transport layer, disposed on a side of the anode and containing a hole transport material, wherein the hole transport material includes an organic small molecule material with a molecular weight less than 4000, and a hole mobility of the hole transport material is not less than $1\times E^{-5}$ $cm^2/(V\cdot S)$; a light-emitting layer, disposed on a side, distal from the anode, of the hole transport layer and containing a quantum dot material; an electron buffer layer, disposed on a side, distal from the hole transport layer, of the light-emitting layer and containing a thermally activated delayed fluorescent material; and a cathode, disposed on a side, distal from the light-emitting layer, of the electron buffer layer. As such, in the light-emitting diode, a hole transport property is improved based on the hole transport layer, and a problem of electron injection over-speed is alleviated based on the electron buffer layer, such that the hole and electron injection balance of the light-emitting diode is improved, and thus the device property is improved and the device life is prolonged.

In the embodiments of the present disclosure, the organic small molecule material includes at least one of an aromatic amine compound, a carbazole compound, a fluorene compound, and derivatives thereof. As such, the hole transport property of the hole transport layer is further improved.

In the embodiments of the present disclosure, based on a total mass of a material of the hole transport layer, a content of the hole transport material in the hole transport layer ranges from 0.1 wt % to 70 wt %. As such, the hole transport property of the hole transport layer is further improved.

In the embodiments of the present disclosure, a difference value between a first singlet state energy level of the thermally activated delayed fluorescent material and a first triplet state energy level of the thermally activated delayed fluorescent material is less than or equal to 0.3 eV. Reduction of luminescence efficiency and shortened life of the device caused by non-radiative Auger recombination on excess electrons are avoided.

In the embodiments of the present disclosure, the thermally activated delayed fluorescent material is shown in formula I:

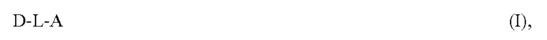

D-L-A (I), wherein D contains an electron-donating group, A contains an electron-withdrawing group, L represents at least one of a single bond, phenyl, biphenyl, and fluorenyl. As such, the property of the light-emitting diode is further improved.

In the embodiments of the present disclosure, D is selected from at least one or more of carbazolyl, aryl amino, alkyl amino, silicyl, alkoxy, aryl oxygen, sulfur, alkyl sulfur, aryl sulfur, acridinyl, phenoxazine, phenothiazine, and derivatives thereof; and A is selected from at least one or more of fluorine, cyano group, triazine, cyano benzene, pyridine, phosphonoxyl, ketocarbonyl, sulfone group, pyrrolyl, thienyl, pyrazolyl, thiazolyl, pyridyl, pyrazinyl, pyrimidyl, pyridazinyl, phenacenyl, and derivatives thereof. As such, the property of the light-emitting diode is further improved.

In the embodiments of the present disclosure, an area of an overlapping portion of an emission spectrum of the thermally activated delayed fluorescent material and an absorption spectrum of the quantum dot material is not less than 50% of an area of the emission spectrum of the thermally activated delayed fluorescent material. As such, the property of the light-emitting diode is further improved.

In the embodiments of the present disclosure, a thickness of the electron buffer layer ranges from 1 nm to 20 nm. As such, the property of the light-emitting diode is further improved.

In the embodiments of the present disclosure, the quantum dot material includes one or more of InP-based quantum dots, ZnSe-based quantum dots, CGS-based quantum dots, CdSe-based quantum dots, CdZn-based quantum dots, CIS-based quantum dots, and CGS-based quantum dots. As such, the property of the light-emitting diode is further improved.

In the embodiments of the present disclosure, the light-emitting diode further includes a hole injection layer, disposed between the anode and the hole transport layer; and an electron injection layer, disposed between the electron buffer layer and the cathode. As such, the property of the light-emitting diode is further improved.

In some embodiments of the present disclosure, a display panel is further provided. In the embodiments of the present disclosure, the display panel includes: a substrate; and a plurality of light-emitting diodes, wherein the plurality of light-emitting diodes are disposed on the substrate, and at least a part of the plurality of light-emitting diodes are the light-emitting diode described above. Thus, the display panel has all features and advantages of the above light-emitting diode, which are not repeated herein. All in all, the display panel has at least one of the advantages of great luminescence efficiency and long life.

In the embodiments of the present disclosure, the plurality of light-emitting diodes are of a plurality of luminescence colors, and an area of an overlapping portion of an emission spectrum of a thermally activated delayed fluorescent material of an electron buffer layer of the light-emitting diode of each luminescence color and an absorption spectrum of a quantum dot material of a light-emitting layer of the light-emitting diode is not less than 50% of an area of the emission spectrum of the thermally activated delayed fluorescent material.

In some embodiments of the present disclosure, a display device is further provided. The display device includes the above display panel. Thus, the display device has all features and advantages of the above display panel, which are not repeated herein. All in all, the display device has at least one of the advantages of great luminescence efficiency and long life.

BRIEF DESCRIPTION OF DRAWINGS

Above and/or additional aspects and technical effects of the present disclosure are obvious and easily understood based on the descriptions of the embodiments in conjunction with the accompanying drawings.

DETAILED DESCRIPTION OF THE INVENTION

Figures 1, 2:
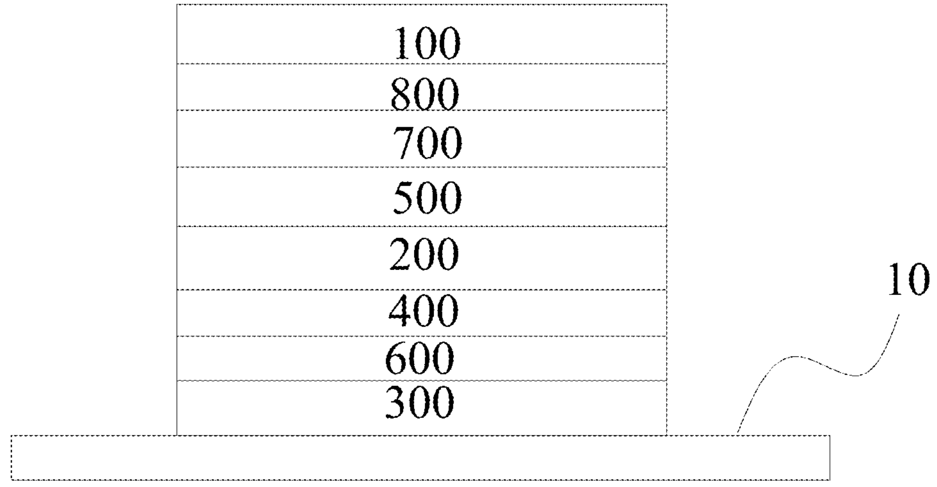
FIG. 1 is a schematic structural diagram of a light-emitting diode according to some embodiments of the present disclosure.
FIG. 2 is a schematic structural diagram of a light-emitting diode according to some embodiments of the present disclosure.

The embodiments of the present disclosure are described hereinafter in detail, examples of which are illustrated in the accompanying drawings. Throughout the accompanying drawings, the same or similar reference numerals represent the same or similar components or components with the same or similar functions. The embodiments described below with reference to the accompanying drawings are exemplary, and are only intended to explain the present disclosure, rather than to limit the present disclosure.

The hole transport layer (HTL) of current QLED is formed by a polymer material. However, a hole mobility of the hole transport layer is less due to a structure of the polymer material, such that a problem of imbalance between electron and hole injection is generated in the QLED.

Thus, the current light-emitting diode, display panel, and display device are to be improved.

In some embodiments of the present disclosure, a light-emitting diode is provided. Referring to FIG. 1, the light-emitting diode includes: an anode 300, a hole transport layer 400, a light-emitting layer 200, an electron buffer layer 500, and a cathode 100. The hole transport layer 400 is disposed on a side of the anode 100, and the hole transport layer contains a hole transport material. The hole transport material includes an organic small molecule material with a molecular weight less than 4000. The light-emitting layer 200 is disposed on a side, distal from the anode 300, of the hole transport layer 400, and the light-emitting layer 200 contains a quantum dot material. A hole mobility of the hole transport material is not less than $1\times E^{-5}$ $cm^2/(V\cdot S)$. The electron buffer layer 500 is disposed on a side, distal from the hole transport layer 400, of the light-emitting layer 200, and the electron buffer layer contains a thermally activated delayed fluorescent material. The cathode 100 is disposed on a side, distal from the light-emitting layer 200, of the electron buffer layer 500. As such, in the light-emitting diode, a hole transport property is improved based on the hole transport layer, and a problem of electron injection over-speed is alleviated based on the electron buffer layer, such that the hole and electron injection balance of the light-emitting diode is improved, and thus the device property is improved and the device life is prolonged.

For convenient understanding, the principles of achieving the above technical effects by the organic light-emitting diode are described simply hereinafter.

As described above, the hole mobility of the hole transport layer containing the polymer material is less due to the structure of the polymer, an electron mobility of another side of the light-emitting layer is great especially in the case that the device includes a structure of a great mobility (for example, an electron transport layer, which generally contains a metal oxide). Thus, two sides of the light-emitting layer is prone to a hole and electron injection imbalance, and the electron injection of the device is excessive. In this case, imbalance between the electrons and the holes in the light-emitting layer is caused by less hole transport property of the hole transport layer, and thus the improvement of the property of QLED is affected. In addition, a shift of a exciton recombination region to an interface of the hole transport layer and the light-emitting layer is caused by excess electrons, the excess electrons cause non-radiative Auger recombination, and the excess electrons are shifted to the hole transport layer to cause dissociation of the hole transport material. Thus, the efficiency of the device is less, and the life is shortened. In the light-emitting diode in the embodiments of the present disclosure, the hole transport property of the hole transport layer is improved by adding some organic molecules with the hole transport property to the material of the hole transport layer, and the electron buffer layer containing the thermally activated delayed fluorescent material (TADF) is added to another side of the light-emitting layer to transport the buffer electrons, such that the balance of the electrons and the holes is adjusted. In addition, the TADF is capable of efficiently converting triplet excitons to singlet excitons, and the singlet excitons are transferred to quantum dots based on Forster fluorescence resonance energy transfer to excite the quantum dots to emit light, such that a current efficiency of the quantum dot electroluminescent device is improved, the efficiency of the device is further improved, and the life is prolonged.

In some embodiments of the present disclosure, the hole transport layer contains one or more hole transport materials, and at least one of the hole transport material is the above organic small molecule material. For example, a common polymer mater is used in the hole transport layer, and the organic small molecule material is added by process of, including but not limited to, blending. As such, the hole transport layer 400 in the embodiments of the present disclosure is simply acquired. Specifically, types of the organic small molecule material are not limited, for example, at least one of an aromatic amine compound, a carbazole compound, a fluorene compound, and derivatives thereof. The organic small molecule material with the above structure has a great hole transport property and a less molecular weight, such that the hole transport property of the hole transport layer is improved, and thus the problem of the imbalance between the electron and hole injection in the light-emitting diode is alleviated.

It should be noted that in the present disclosure, the term "derivative" should be understood broadly. That is, in addition to the above characteristic groups, one or more substituent groups are contained in a compound, including, but not limited to the alkyl or aromatic rings. The substituent group include, but is not limited to, alkyl, hydroxyl, carboxyl, amino, halogen, and the like, or polycyclic aromatic hydrocarbons containing the above characteristic functional groups.

In some embodiments of the present disclosure, a content of the hole transport material, that is, the above organic small molecule material, in the hole transport layer is not limited, and those skilled in the art can adjust based on actual requirements. For example, based on a total mass of a material of the hole transport layer, a content of the hole transport material ranges from 0.1 wt % to 70 wt %. As such, the hole transport property of the hole transport layer is further improved.

In some embodiments of the present disclosure, a difference value between a first singlet state energy level (S1) of the thermally activated delayed fluorescent material and a first triplet state energy level (T1) of the thermally activated delayed fluorescent material is less than or equal to 0.3 eV. As such, the reduction of luminescence efficiency and shortened life of the device caused by non-radiative Auger recombination on excess electrons are avoided.

In some embodiments of the present disclosure, the hole mobility of the hole transport material of the hole transport layer is not limited, for example, not less than $1\times E^{-5}$ $cm^2/(V\cdot S)$. Specifically, the hole mobility of the organic small molecule material is not less than $1\times E^{-4}$ $cm^2/(V\cdot S)$. A difference of hole mobility between polymer hole transport material and the organic small molecule material in the hole transport layer is one order of magnitude. As such, a speed of transporting the hole is greatly adjusted.

The thermally activated delayed fluorescent material (TADF) is a novel organic light-emitting material with less cost and great efficiency, and is also referred to as a third generation of organic light-emitting material. Base on smart molecule design, the molecule of the material has a minimum difference in energy level between the singlet state and the triplet state (ΔEST), and triplet excitons are converted into singlet excitons radiative luminescence based on thermally excited transversal intersystem crossing, such that a theoretical limit of 25% exciton utilization of the conventional fluorescent materials is broken. It is further found by the inventors that by adding such material in the electron buffer layer, the electron transport speed is appropriately adjusted on the premise that the electron injection is not affected, such that the problem of the excess electron injection is alleviated. In addition, such material can stimulate quantum dots to emit light, improve the efficiency of the device, and alleviate negative effects of non-radiative Auger recombination caused by excess electrons on the efficiency of the device. In some embodiments of the present disclosure, the specific type of the thermally activated delayed fluorescent material is not limited, for example, shown in formula I:

$$D\text{-}L\text{-}A \quad (I),$$

wherein D contains an electron-donating group, A contains an electron-withdrawing group, L represents at least one of a single bond, phenyl, biphenyl, and fluorenyl. As such, the property of the light-emitting diode is further improved. As such, the property of the light-emitting diode is further improved. In some embodiments, D is selected from at least one or more of carbazolyl, aryl amino, alkyl amino, silicyl, alkoxy, aryl oxygen, sulfur, alkyl sulfur, aryl sulfur, acridinyl, phenoxazine, phenothiazine, and derivatives thereof; and A is selected from at least one or more of fluorine, cyano group, triazine, cyano benzene, pyridine, phosphonoxyl, ketocarbonyl, sulfone group, pyrrolyl, thienyl, pyrazolyl, thiazolyl, pyridyl, pyrazinyl, pyrimidyl, pyridazinyl, phenacenyl, and derivatives thereof. As such, the property of the light-emitting diode is further improved.

In the embodiments of the present disclosure, an area of an overlapping portion of an emission spectrum of the thermally activated delayed fluorescent material and an absorption spectrum of the quantum dot material is not less than 50% of an area of the emission spectrum of the thermally activated delayed fluorescent material. As such, a ratio of the area of the overlapping portion of the emission spectrum of the thermally activated delayed fluorescent material and the absorption spectrum of the quantum dot to the area of the emission spectrum of the thermally activated delayed fluorescent material is great, that is, the quantum dot material in the light-emitting layer is greatly fitted with the spectrum of the thermally activated delayed fluorescent material, such that the luminescence efficiency of the device is improved.

In the embodiments of the present disclosure, a thickness of the electron buffer layer is not limited, and those skilled in the art can select based on actual requirements. For example, the electron buffer layer contains a bulk material for dispersing the thermally activated delayed fluorescent material, and the thickness of the formed electron buffer layer ranges from 1 nm to 20 nm. As such, the property of the light-emitting diode is further improved.

In the embodiments of the present disclosure, the quantum dot material is not limited, and those skilled in the art can select appropriate quantum dot material based on actual requirements. For example, in the present disclosure, the quantum dot material includes one or more of InP-based quantum dots, ZnSe-based quantum dots, CGS-based quantum dots, CdSe-based quantum dots, CdZn-based quantum dots, CIS-based quantum dots, and CGS-based quantum dots. As such, the property of the light-emitting diode is further improved.

In the embodiments of the present disclosure, for further improvements of the property of the light-emitting diode, referring to FIG. 2, the light-emitting diode further includes a hole injection layer 600, an electron injection layer 800, and the like. The hole injection layer 600 is disposed between the anode 300 and the hole transport layer 400 to further improve the hole injection property. The electron transport layer 700 is disposed on a side, distal from the light-emitting layer, of the electron buffer layer 500, and the electron injection layer 800 is disposed between the electron buffer layer 500 and the cathode 100, specifically on a side, distal from the electron buffer layer 500, of the electron transport layer 700. As such, the property of the light-emitting diode is further improved.

It should be noted that a method for manufacturing the above light-emitting diode is limited, and those skilled in the art can select based on actual requirements. For example, the electrode structure of the anode and the cathode is formed by the method including, but not limited to, evaporating, and sputtering and depositing the conductive material. Specifically, a structure including the hole injection layer, the hole transport layer, and the light-emitting layer is formed by spinning on a substrate including the conductive mater (for example, ITO), and then the electron buffer layer is formed by vacuum evaporating. The electron injection layer is formed by depositing and evaporating, and then the metal anode is formed by evaporating. Specifically, thicknesses of the above layers are not limited, and those skilled in the art can select based on actual requirements. For example, a thickness of the hole injection layer ranges from 10 nm to 30 nm, a thickness of the hole transport layer ranges from 30 nm to 40 nm, and a thickness of the light-emitting layer ranges from 20 nm to 30 nm. Those skilled in the art can determine the thicknesses of the above layers based on specific materials of the above layers.

For example, in some embodiments of the present disclosure, the light-emitting diode is formed by following structures: the anode, the hole injection layer, the hole transport layer, the light-emitting layer, the electron buffer layer, the electron injection layer, and the cathode. The hole injection layer is disposed on a side of the anode, the hole transport layer is disposed on a side, distal from the anode, of the hole injection layer, the light-emitting layer is disposed on a side, distal from the anode, of the hole transport layer, and the light-emitting layer contains the quantum dot material. The electron buffer layer is disposed on a side, distal from the hole transport layer, of the light-emitting layer, the electron buffer layer contains a thermally activated delayed fluorescent material, the cathode is disposed on a side, distal from the light-emitting layer, of the electron buffer layer, and the electron injection layer is disposed between the electron buffer layer and the cathode. As such, the property of the light-emitting diode is further improved.

In some embodiments of the present disclosure, a display panel is further provided. In the embodiments of the present disclosure, the display panel includes: a substrate; and a plurality of light-emitting diodes. The plurality of light-emitting diodes are disposed on the substrate, and at least a part of the plurality of light-emitting diodes are the light-emitting diode described above. Thus, the display panel has all features and advantages of the above light-emitting diode, which are not repeated herein. All in all, the display panel has at least one of the advantages of great luminescence efficiency and long life.

In the embodiments of the present disclosure, the plurality of light-emitting diodes are of a plurality of luminescence colors. For example, in some embodiments of the present disclosure, the plurality of light-emitting diodes are red, green, and blue light-emitting diodes. An area of an overlapping portion of an emission spectrum of a thermally activated delayed fluorescent material of an electron buffer layer of the light-emitting diode of each luminescence color and an absorption spectrum of a quantum dot material of the light-emitting layer of the light-emitting diode is not less than 50% of an area of the emission spectrum of the thermally activated delayed fluorescent material. That is, for the red light-emitting diode, an area of an overlapping portion of an emission spectrum of a thermally activated delayed fluorescent material of an electron buffer layer of the red light-emitting diode and an absorption spectrum of a quantum dot material of the light-emitting layer of the red light-emitting diode is not less than 50% of an area of the emission spectrum of the thermally activated delayed fluorescent material of the red light-emitting diode. Likewise, in the blue, green, and the like light-emitting diode, an overlapping portion of an emission spectrum of a thermally activated delayed fluorescent material and an absorption spectrum of a quantum dot material of the light-emitting layer of the light-emitting diode of the corresponding color also meet above requirements. As such, the property of the light-emitting diode is further improved.

Figure 8:
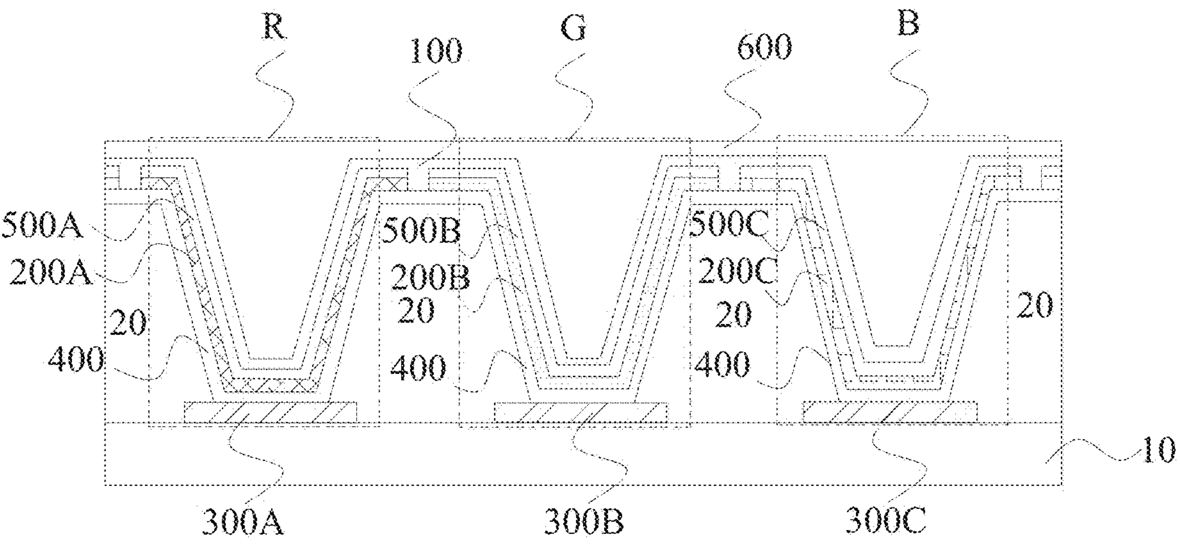
FIG. 8 is a schematic structural diagram of a display panel according to some embodiments of the present disclosure.

Referring to FIG. 8, the display panel is provided with a substrate 10, and a pixel definition layer 20 on a side of the substrate 10 for defining a plurality of light-emitting diode regions. The plurality of light-emitting diode regions are spared apart, for example, the red (R) light-emitting diode, the green (G) light-emitting diode, the blue(B) light-emitting diode. The anode 300A, the hole transport layer 400, the light-emitting layer 200A, and the electron buffer layer 500A are disposed on a same light-emitting diode region, and the plurality of light-emitting diodes share the cathode 100. Materials of the anodes (for example, 300A, 300B, and 300C shown in drawings) of the plurality of light-emitting diodes are the same or different, materials of the hole transport layers (for example, 400 shown in drawings) are the same or different, that is, the plurality of light-emitting diodes share a same layer of material to function as the hole transport layer. The quantum dot materials of the light-emitting layer (for example, 200A, 200B, and 200C shown in drawings) are different to form different luminescence colors. Materials of the electron buffer layers (for example, 500A, 500B, and 500C shown in drawings) on a side, distal from the substrate, of the light-emitting layer are different. As described above, the thermally activated delayed fluorescent material of the electron buffer layer is adjusted based on the quantum dot materials of the light-emitting layer to ensure the luminescence efficiencies of the diodes of different luminescence colors. In addition, a seal structure 600 is further provided on a side, distal from the substrate 10, of the cathode 100, such that the light-emitting diode is sealed in the substrate 10 to avoid erosion on the light-emitting diode caused by external water oxygen. The seal structure 600 includes a laminated layer structure formed by a plurality of inorganic and organic materials to achieve great seal.

In some embodiments of the present disclosure, a display device is further provided. The display device includes the above display panel. Thus, the display device has all features and advantages of the above display panel, which are not repeated herein. All in all, the display device has at least one of the advantages of great luminescence efficiency and long life.

The following specific examples are used to illustrate the present disclosure. It should be understood by those skilled in the art that the specific examples below are used for illustrative purposes only and do not be constructed as a limitation of the scope of the present disclosure. In addition, in the following examples, the materials and equipment are commercially available unless otherwise noted. In the case that the specific processing conditions and methods are not clearly described in the following examples, they can be processed by common conditions and methods in the field.

Example 1

A structure of a device: anode ITO/hole injection layer HIL (20 nm)/hole transport layer HTL: compound 1 (22 nm, 30%)/light-emitting layer: EML (12 nm)/electron buffer layer: compound 2: compound 3 (5 nm, 70%: 30%)/electron injection layer: ET-1: LIQ (30 nm, 1:1)/LIF (0.5 nm)/cathode: Al (100 nm).

Compound 1

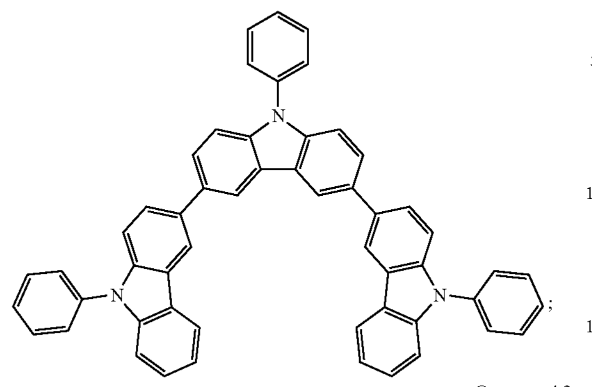

Compound 2

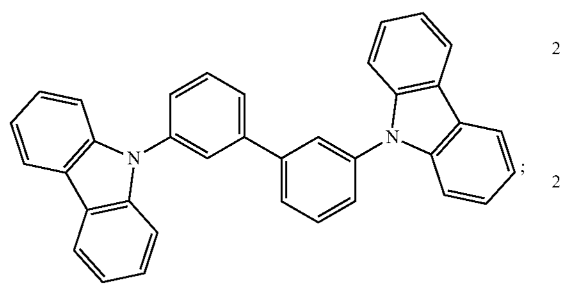

Compound 3

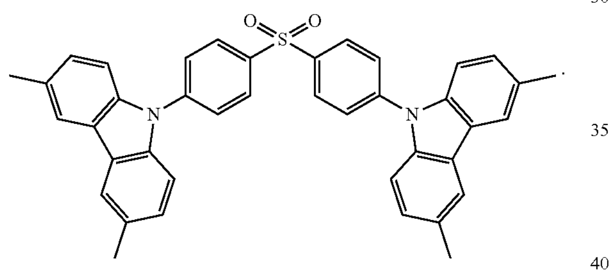

The compound 1 is a small molecule organic material, the compound 3 is a thermally activated delayed fluorescent material, and the compound 2 is the bulk material for dispersing the compound 2.

At first, a glass substrate including ITO (an anode) was cleaned, a layer of HIL material was spun on a side, including ITO, of the cleaned glass substrate and then backed at 140° C. for 30 min, and a thickness of the formed HIL is 20 nm. Then, a pre-mixed HTL material, that is, a solution of the compound 1 (with a content of 30 wt %) shown in following formula was spun on the HIL and backed at 140° C. for 30 min to form HTL, and then CGS/ZnS quantum dots were spun on the HTL and annealed at 60° C. for 15 min to form a light-emitting layer with a thickness of 12 nm. Then, the compound 2 and the compound 3 (contents of 70 wt % and 30 wt % respectively) were deposited by vacuum evaporating at a vacuum less than $4\times10^{-4}$ Pa. Specifically, different evaporation sources were evaporated to corresponding thicknesses (5 nm) of film layers to function as the electron buffer layer, and then the ET-1 and LiO were deposited with a ratio of masses being 50%:50%. Specifically, after different evaporation sources were evaporated to corresponding thicknesses (30 nm) of film layers, LiF was evaporated on the above the film layers to function as the electron injection layer, and then Al was evaporated to function as the cathode.

Figure 3:
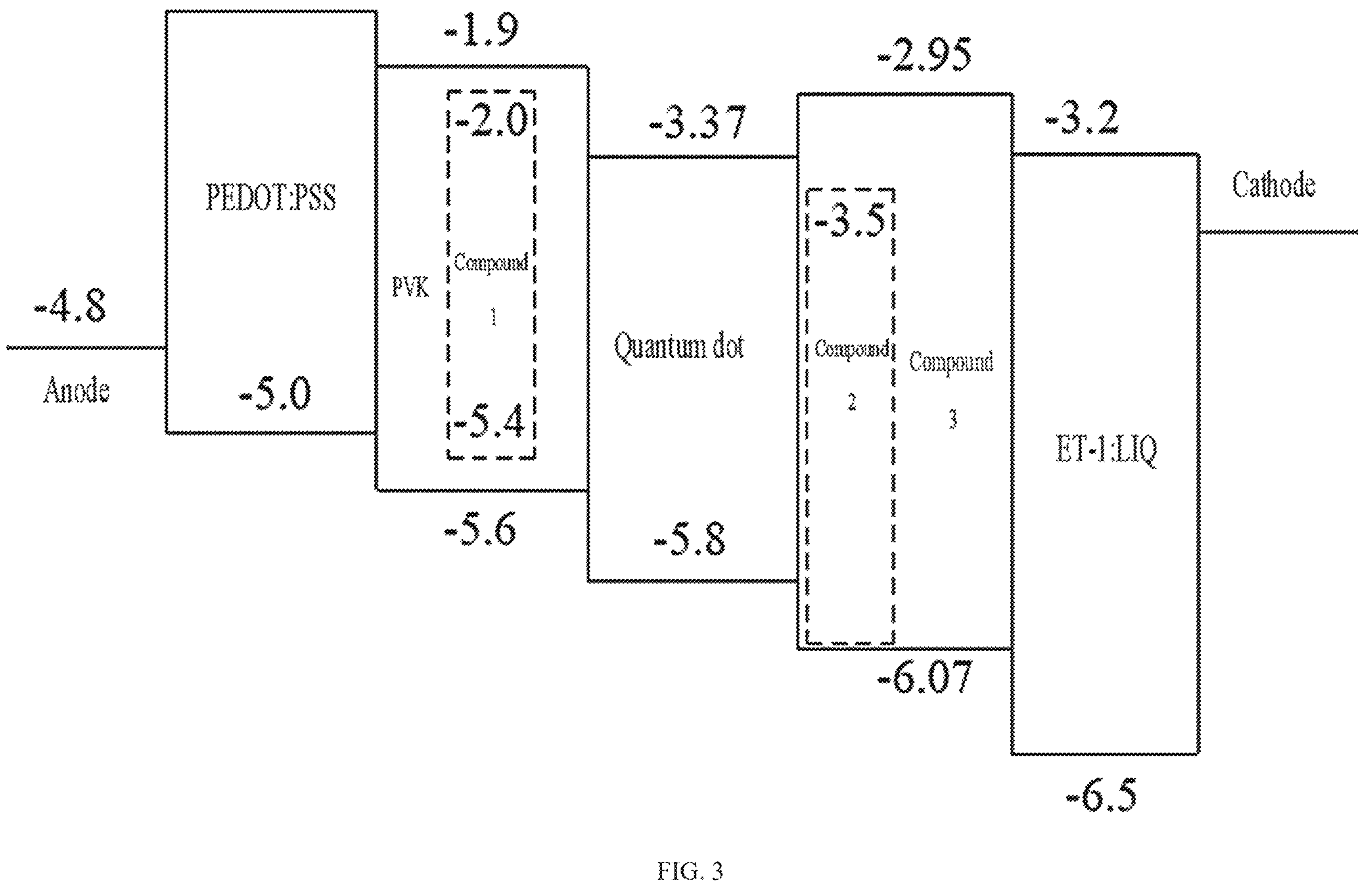
FIG. 3 is a schematic structural diagram of an energy level of a light-emitting diode according to some embodiments of the present disclosure.

A structure of the energy level of the device acquired in Example 1 is illustrated in FIG. 3. As shown in FIG. 3, energy levels of the layers of the device are fitted well.

Example 2

Compound 4

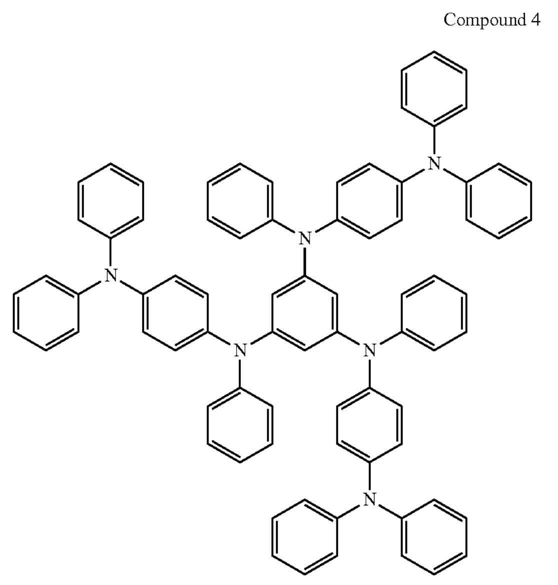

Compound 5

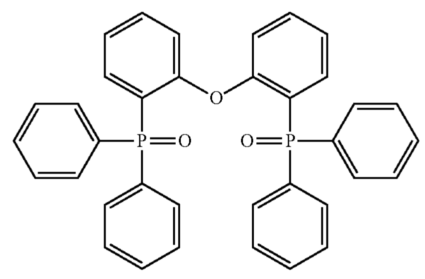

Compound 6

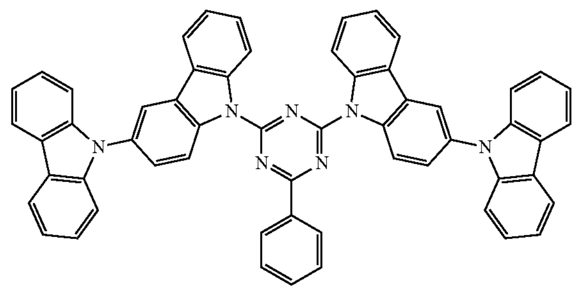

The method for manufacturing the device and that in Example 1 are similar, and differ in that the compound 1 is replaced with compound 4, the compound 2 is replaced with compound 5, and the compound 3 is replaced with compound 6.

Example 3

Compound 7

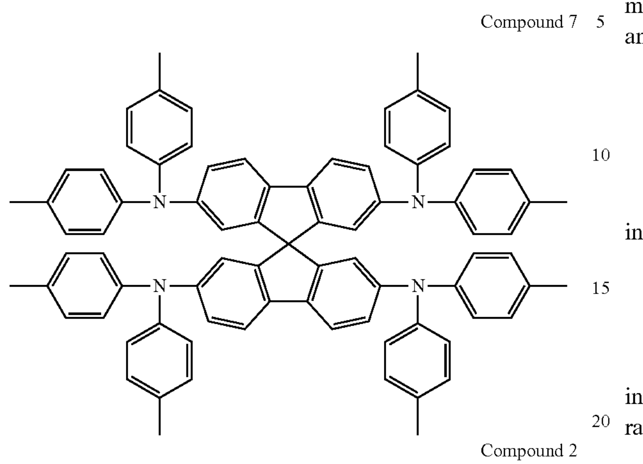

Compound 2

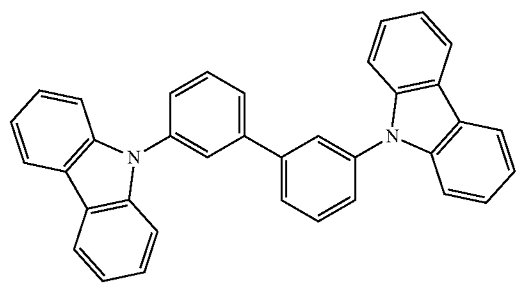

Compound 8

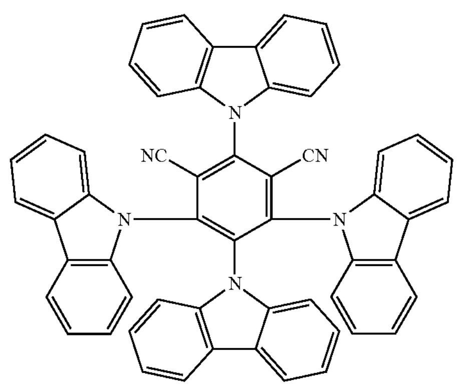

The method for manufacturing the device and that in Example 1 are similar, and differ in that the compound 1 is replaced with compound 7, the compound 2 is still the bulk material of thermally activated delayed fluorescent material, and the compound 3 is replaced with compound 8.

Example 4

The structure and that in Example 1 are similar, and differ in that the anode is ITO/Ag/ITO.

Example 5

The structure and that in Example 1 are similar, and differ in that the cathode is a MgAg co-evaporation layer and a ratio of Mg and Ag is 1:1.

Comparative Example 1

The parameters and that in Example 1 are similar, and differ in that the hole transport layer do not include the compound 1 and the electron buffer layer is not disposed in Comparative Example 1.

Comparative Example 2

The parameters and that in Example 1 are similar, and differ in that the hole transport layer do not include the compound 1 in Comparative Example 2.

Comparative Example 3

The parameters and that in Example 1 are similar, and differ in that the electron buffer layer is not disposed in Comparative Example 3.

Devices formed in Example 1 and Comparative Examples 1 to 3 were tested, and the test data was acquired at a current density J of 15 mA/cm−2. The test results are shown in following Table 1.

TABLE 1

| Device | Light voltage of the device (V) | Current efficiency (cd/A) | Wavelength of light-emitting peak (nm) |
|---|---|---|---|
| Example 1 | 3.82 | 36.4 | 530 |
| Example 2 | 3.91 | 34.1 | 531 |
| Example 3 | 4.01 | 33.6 | 530 |
| Comparative Example 1 | 4.65 | 23.7 | 528 |
| Comparative Example 2 | 4.34 | 30.1 | 528 |
| Comparative Example 3 | 4.22 | 28.3 | 527 |

Figure 4:
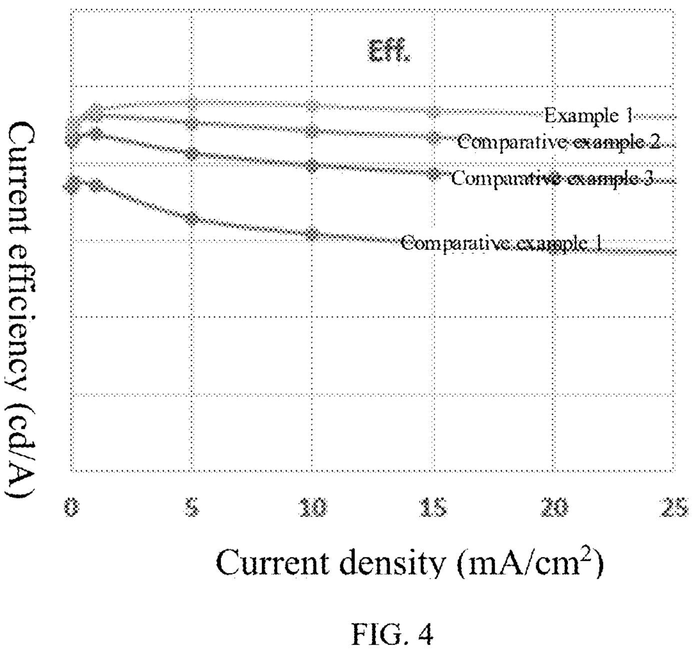
FIG. 4 is a schematic diagram of a result of a current efficiency test of Example 1 of the present disclosure and Comparative Examples 1, 2, and 3.
Figure 5:
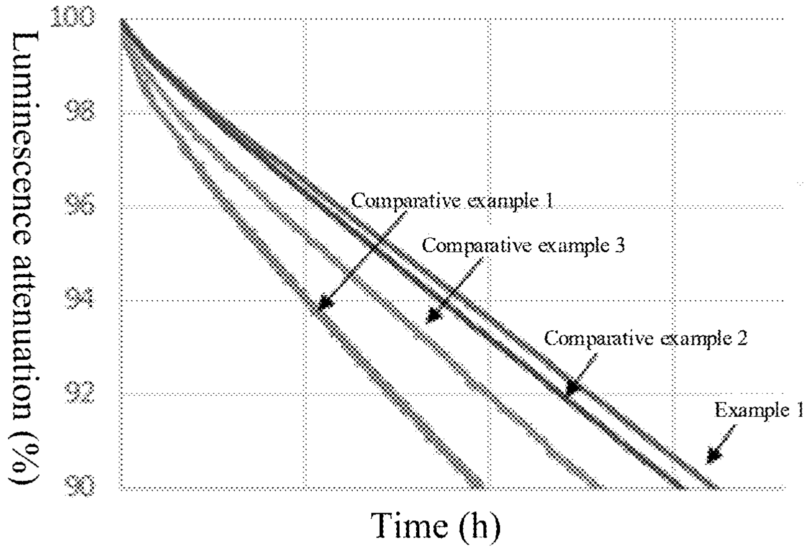
FIG. 5 is a schematic diagram of a result of a luminescence attenuation test of Example 1 of the present disclosure and Comparative Examples 1, 2, and 3.
Figure 6:
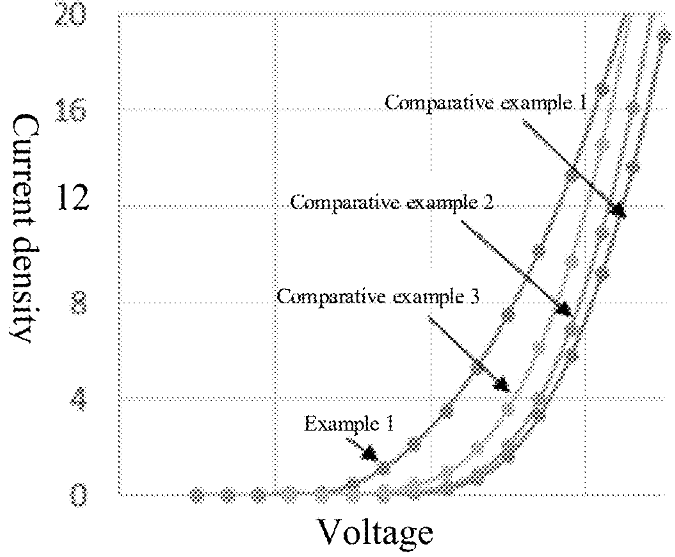
FIG. 6 is a schematic diagram of J-V curves of Example 1 of the present disclosure and Comparative Examples 1, 2, and 3.

It can be seen based on above Table 1 and FIGS. 4 to 6 that the device in Example 1 has the greatest device property, the greatest current efficiency, and the wavelength of light-emitting peak is not obviously shifted. In addition, referring to FIG. 5, in the Example 1 of the present disclosure, the attention of the luminance is smallest, and the life is longest compares with the Comparative Examples 1 to 3.

The test properties of Comparative Examples 4 to 5 are similar to that of Example 1.

For clearer evaluation of the effect of the above compound 1 on the hole migration capacity, a single carrier device is manufactured to illustrate.

Example 6

Manufacturing a single carrier device HOD-1

A structure of a device: ITO/HIL (20 nm)/HTL: compound 1 (50 nm, 30%)/Al (100 nm)

A layer of HIT was spun on a cleaned glass substrate including ITO, and then backed at 140° C. for 30 min to form HIL, a pre-mixed solution of HTL and compound was spun on the HIL and backed at 140° C. for 30 min to form HTL, and then Al was evaporated to function as the cathode by vacuum evaporating at a vacuum less than $4\times10^{-4}$ Pa.

Comparative Example 4

The structure and that in Example 6 are similar, and differ in that the compound 1 is not added in HTL in Example 4.

Figure 7:
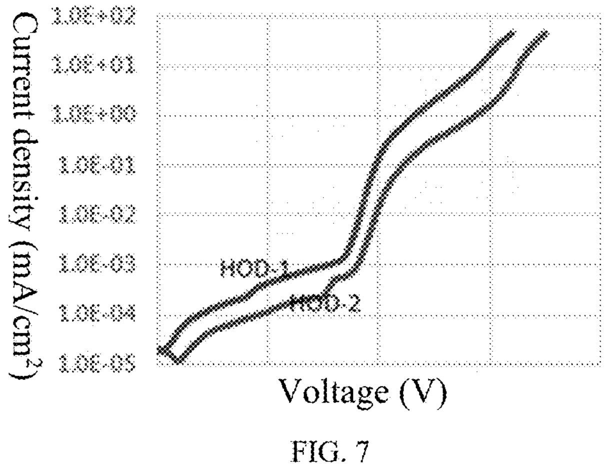
FIG. 7 is a schematic diagram of a result of a current density test of Example 6 of the present disclosure and Comparative Example 4.

Referring to FIG. 7, it can be seen from J-V curves of Example 6 and Comparative Example 4 that Example 6 of adding the compound 1 shows a greater hole mobility.

In the descriptions of the present specification, the descriptions about reference terms such as “an embodiment,” “another embodiment,” and the like mean that the specific features, structures, materials or characteristics described in combination with the embodiments are included in at least one embodiment of the present disclosure. In the present specification, the schematic descriptions of the above terms do not necessarily refer to a same embodiment or example. Furthermore, the specific features, structures, materials or characteristics as described can be integrated with any one or more embodiments or examples in a proper manner. In addition, without contradiction, those skilled in the art may combine and integrate the different embodiments or examples described in the specification and the characteristics of the different embodiments or examples.

Although the embodiments of the present disclosure have been shown and described above, it can be understood that the above embodiments are illustrative, and cannot be constructed as the limitation of the present disclosure, and those skilled in the art can change, modify, substitute, and vary the above embodiments within the scope of the present disclosure.

The invention claimed is:

1. A light-emitting diode, comprising:

an anode;

a hole transport layer, disposed on a side of the anode and containing a hole transport material, wherein the hole transport material comprises an organic small molecule material with a molecular weight less than 4000, and a hole mobility of the hole transport material is not less than $1\times E^{-5}$ $cm^2/(V\cdot S)$;

a light-emitting layer, disposed on a side, distal from the anode, of the hole transport layer, and containing a quantum dot material;

an electron buffer layer, disposed on a side, distal from the hole transport layer, of the light-emitting layer, and containing a thermally activated delayed fluorescent material; and a cathode, disposed on a side, distal from the light-emitting layer, of the electron buffer layer.

2. The light-emitting diode according to claim 1, wherein the organic small molecule material comprises at least one of an aromatic amine compound, a carbazole compound, a fluorene compound, and derivatives thereof.

3. The light-emitting diode according to claim 2, wherein based on a total mass of a material of the hole transport layer, a content of the hole transport material in the hole transport layer ranges from 0.1 wt % to 70 wt %.

4. The light-emitting diode according to claim 1, wherein a difference value between a first singlet state energy level of the thermally activated delayed fluorescent material and a first triplet state energy level of the thermally activated delayed fluorescent material is less than or equal to 0.3 eV.

5. The light-emitting diode according to claim 4, wherein the thermally activated delayed fluorescent material is shown in formula I:

D-L-A (I), wherein D contains an electron-donating group, A contains an electron-withdrawing group, L represents at least one of a single bond, phenyl, biphenyl, and fluorenyl.

6. The light-emitting diode according to claim 5, wherein

D is selected from at least one or more of carbazolyl, aryl amino, alkyl amino, silicyl, alkoxy, aryl oxygen, sulfur, alkyl sulfur, aryl sulfur, acridinyl, phenoxazine, phenothiazine, and derivatives thereof; and A is selected from at least one or more of fluorine, cyano group, triazine, cyano benzene, pyridine, phosphonoxyl, ketocarbonyl, sulfone group, pyrrolyl, thienyl, pyrazolyl, thiazolyl, pyridyl, pyrazinyl, pyrimidyl, pyridazinyl, phenacenyl, and derivatives thereof.

7. The light-emitting diode according to claim 1, wherein an area of an overlapping portion of an emission spectrum of the thermally activated delayed fluorescent material and an absorption spectrum of the quantum dot material is not less than 50% of an area of the emission spectrum of the thermally activated delayed fluorescent material.

8. The light-emitting diode according to claim 1, wherein a thickness of the electron buffer layer ranges from 1 nm to 20 nm.

9. The light-emitting diode according to claim 1, wherein the quantum dot material comprises one or more of InP-based quantum dots, ZnSe-based quantum dots, CGS-based quantum dots, CdSe-based quantum dots, CdZn-based quantum dots, CIS-based quantum dots, and CGS-based quantum dots.

10. The light-emitting diode according to claim 1, further comprising:

a hole injection layer, disposed between the anode and the hole transport layer; and an electron injection layer, disposed between the electron buffer layer and the cathode.

11. A display panel, comprising:

a substrate; and a plurality of light-emitting diodes, wherein the plurality of light-emitting diodes are disposed on the substrate, and at least a part of the plurality of light-emitting diodes are a light-emitting diode comprising:

an anode;

a hole transport layer, disposed on a side of the anode and containing a hole transport material, wherein the hole transport material comprises an organic small molecule material with a molecular weight less than 4000, and a hole mobility of the hole transport material is not less than $1\times E^{-5}$ $cm^2/(V\cdot S)$;

a light-emitting layer, disposed on a side, distal from the anode, of the hole transport layer, and containing a quantum dot material;

an electron buffer layer, disposed on a side, distal from the hole transport layer, of the light-emitting layer, and containing a thermally activated delayed fluorescent material; and a cathode, disposed on a side, distal from the light-emitting layer, of the electron buffer layer.

12. The display panel according to claim 11, wherein the plurality of light-emitting diodes are of a plurality of luminescence colors, and an area of an overlapping portion of an emission spectrum of a thermally activated delayed fluorescent material of an electron buffer layer of the light-emitting diode of each luminescence color and an absorption spectrum of a quantum dot material of a light-emitting layer of the light-emitting diode is not less than 50% of an area of the emission spectrum of the thermally activated delayed fluorescent material.

13. A display device, comprising: a display panel, wherein the display panel comprises: a substrate; and a plurality of light-emitting diodes, wherein the plurality of light-emitting diodes are disposed on the substrate, and at least a part of the plurality of light-emitting diodes are a light-emitting diode comprising:

an anode;

a hole transport layer, disposed on a side of the anode and containing a hole transport material, wherein the hole transport material comprises an organic small molecule material with a molecular weight less than 4000, and a hole mobility of the hole transport material is not less than $1\times E^{-5}$ $cm^2/(V\cdot S)$;

a light-emitting layer, disposed on a side, distal from the anode, of the hole transport layer, and containing a quantum dot material;

an electron buffer layer, disposed on a side, distal from the hole transport layer, of the light-emitting layer, and containing a thermally activated delayed fluorescent material; and a cathode, disposed on a side, distal from the light-emitting layer, of the electron buffer layer.

14. The display panel according to claim 11, wherein the organic small molecule material comprises at least one of an aromatic amine compound, a carbazole compound, a fluorene compound, and derivatives thereof.

15. The display panel according to claim 14, wherein based on a total mass of a material of the hole transport layer, a content of the hole transport material in the hole transport layer ranges from 0.1 wt % to 70 wt %.

16. The display panel according to claim 11, wherein a difference value between a first singlet state energy level of the thermally activated delayed fluorescent material and a first triplet state energy level of the thermally activated delayed fluorescent material is less than or equal to 0.3 eV.

17. The display panel according to claim 16, wherein the thermally activated delayed fluorescent material is shown in formula I:

D-L-A (I), wherein D contains an electron-donating group, A contains an electron-withdrawing group, L represents at least one of a single bond, phenyl, biphenyl, and fluorenyl.

18. The display panel according to claim 17, wherein

D is selected from at least one or more of carbazolyl, aryl amino, alkyl amino, silicyl, alkoxy, aryl oxygen, sulfur, alkyl sulfur, aryl sulfur, acridinyl, phenoxazine, phenothiazine, and derivatives thereof; and A is selected from at least one or more of fluorine, cyano group, triazine, cyano benzene, pyridine, phosphonoxyl, ketocarbonyl, sulfone group, pyrrolyl, thienyl, pyrazolyl, thiazolyl, pyridyl, pyrazinyl, pyrimidyl, pyridazinyl, phenacenyl, and derivatives thereof.

19. The display panel according to claim 11, wherein an area of an overlapping portion of an emission spectrum of the thermally activated delayed fluorescent material and an absorption spectrum of the quantum dot material is not less than 50% of an area of the emission spectrum of the thermally activated delayed fluorescent material.

20. The display panel according to claim 11, wherein a thickness of the electron buffer layer ranges from 1 nm to 20 nm.

* * * * *